United States Patent
Kim et al.

(10) Patent No.: US 10,754,586 B2
(45) Date of Patent: Aug. 25, 2020

(54) STORAGE DEVICE AND METHOD OF OPERATING THE SAME

(71) Applicant: SK hynix Inc., Gyeonggi-do (KR)

(72) Inventors: Jin Soo Kim, Gyeonggi-do (KR); Soong Sun Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/673,525

(22) Filed: Nov. 4, 2019

(65) Prior Publication Data
US 2020/0065031 A1 Feb. 27, 2020

Related U.S. Application Data

(63) Continuation of application No. 15/919,704, filed on Mar. 13, 2018, now Pat. No. 10,503,436.

(30) Foreign Application Priority Data

Aug. 22, 2017 (KR) .................. 10-2017-0106134

(51) Int. Cl.
| | |
|---|---|
| *G11C 16/04* | (2006.01) |
| *G06F 3/06* | (2006.01) |
| *G01C 19/00* | (2013.01) |
| *G01V 7/00* | (2006.01) |
| *G01C 17/02* | (2006.01) |
| *G01P 15/00* | (2006.01) |
| *G11C 16/22* | (2006.01) |

(52) U.S. Cl.
CPC ........... *G06F 3/0659* (2013.01); *G01C 17/02* (2013.01); *G01C 19/00* (2013.01); *G01P 15/00* (2013.01); *G01V 7/00* (2013.01); *G06F 3/0622* (2013.01); *G06F 3/0679* (2013.01); *G11C 16/22* (2013.01); *G11C 16/0483* (2013.01)

(58) Field of Classification Search
CPC ................................. G11C 16/22; G06F 11/00
See application file for complete search history.

(56) References Cited

U.S. PATENT DOCUMENTS

| | | | | |
|---|---|---|---|---|
| 2005/0105331 | A1* | 5/2005 | Lee .......... | G11C 16/22 365/185.11 |
| 2006/0010340 | A1* | 1/2006 | Makela ........... | G01P 15/0891 714/38.14 |
| 2015/0039868 | A1* | 2/2015 | Belmar .............. | G06F 9/30087 712/227 |
| 2016/0335011 | A1* | 11/2016 | Lee ............. | G06F 3/0619 |
| 2018/0039437 | A1* | 2/2018 | Olarig ........... | G06F 3/0622 |

\* cited by examiner

*Primary Examiner* — Uyen Smet
(74) *Attorney, Agent, or Firm* — IP & T Group LLP

(57) ABSTRACT

Provided herein may be a storage device and a method of operating the same. A storage device for protecting the storage device from physical movement may include a nonvolatile memory device, a sensor unit configured to collect information about physical movement of the storage device, and a memory controller configured to perform a device lock operation of protecting data in the nonvolatile memory device, based on a sensor value acquired from the sensor unit.

16 Claims, 12 Drawing Sheets

STORAGE DEVICE AND METHOD OF OPERATING THE SAME

CROSS-REFERENCE TO RELATED APPLICATION

This application is a continuation of U.S. patent application Ser. No. 15/919,704 filed on Mar. 13, 2018, which claims benefits of priority of Korean Patent Application No. 10-2017-0106134 filed on Aug. 22, 2017. The disclosure of each of the foregoing application is incorporated herein by reference in its entirety.

BACKGROUND

Field of Invention

Various embodiments of the present disclosure generally relate to an electronic device, and more particularly, to a storage device and a method of operating the storage device.

Description of Related Art

A storage device is a device for storing data under the control of a host device, such as a computer, a smart phone, or a smart pad. Examples of a storage device include a device for storing data in a magnetic disk, as in the case of a hard disk drive (HDD), and a device for storing data in a semiconductor memory, especially in a nonvolatile memory, as in the case of a solid state drive (SSD) or a memory card.

Representative examples of a nonvolatile memory include a read-only memory (ROM), a programmable ROM (PROM), an electrically programmable ROM (EPROM), an electrically erasable and programmable ROM (EEPROM), a flash memory, a phase-change random access memory (PRAM), a magnetic RAM (MRAM), a resistive RAM (RRAM), a ferroelectric RAM (FRAM), etc.

SUMMARY

Various embodiments of the present disclosure are directed to a storage device and a method of operating the storage device, which may protect the storage device from damage caused by physical movement.

An embodiment of the present disclosure provides a storage device including a nonvolatile memory device, a sensor unit configured to collect information about physical movement of the storage device, and a memory controller configured to perform a device lock operation of protecting data in the nonvolatile memory device, based on a sensor value acquired from the sensor unit.

Another embodiment of the present disclosure provides a memory controller for controlling a memory device. The memory controller may include a device lock detection unit configured to output a detection signal when a sensor value related to a physical movement of the storage device, acquired from an external sensor unit, exceeds a threshold, a device lock mode setting unit configured to lock the storage device and output an enable signal indicating that the storage device is in locked status when a device lock mode, indicating whether a device lock operation of protecting data in the memory device is activated, is in enable state, and the detection signal is inputted, and a device lock processing unit configured to output an abort signal to an external host without executing a command provided from the external host, in response to the enable signal.

These and other features and advantages of the present invention will become apparent to those skilled in the art to which the present invention belongs from the following detailed description in conjunction with the accompanying drawings.

DETAILED DESCRIPTION

Figure 1:
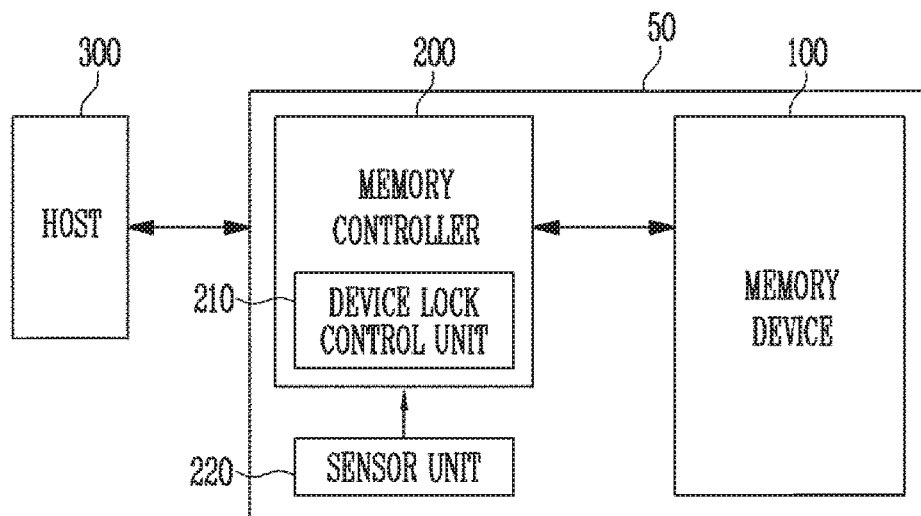
FIG. 1 is a diagram illustrating a storage device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural from as long as it is not specifically mentioned in a sentence. Furthermore, the terms "include/comprise" or "including/comprising" used in the specification represent that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a diagram illustrating a storage device 50 according to an embodiment of the present disclosure.

Referring to FIG. 1, the storage device 50 may include a memory device 100, a memory controller 200, and a sensor unit 220.

The memory device 100 may store data for a host 300 that is operatively coupled to the memory device. The memory device 100 is operated under the control of the memory controller 200. The memory device 100 may include a memory cell array including a plurality of memory cells in which data is stored. Exemplary embodiments of the memory device 100 may include a Double Data Rate Synchronous Dynamic Random Access Memory (DDR SDRAM), a Low Power Double Data Rate4 (LPDDR4) SDRAM, a Graphics Double Data Rate (GDDR) SDRAM, a Low Power DDR (LPDDR) SDRAM, a Rambus Dynamic Random Access Memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In an embodiment, the memory device 100 may be implemented as a three-dimensional (3D) structure. The present disclosure may also be applied not only to a flash memory in which a charge storage layer is implemented as a conductive floating gate (FG), but also to a charge trap flash (CTF) memory in which a charge storage layer is implemented as an insulating layer.

The memory device 100 may receive a command and an address from the memory controller 200, and access a memory region, selected in response to the address, in the memory cell array. That is, the memory device 100 may perform an operation corresponding to the command on the memory region selected in response to the address. For example, the memory device 100 may perform a program operation, a read operation, or an erase operation. During a program operation, the memory device 100 may program data in the memory region selected in response to the address. During a read operation, the memory device 100 may read data from the memory region selected in response to the address. During an erase operation, the memory device 100 may erase data stored in the memory region selected in response to the address.

The memory controller 200 may control the overall operation of the memory device 100. The memory controller 200 may control the operation of the memory device 100 in response to a request received from a host 300 or regardless of the request received from the host 300.

For example, the memory controller 200 may control the memory device 100 so that a program operation, a read operation or an erase operation is performed in response to the request received from the host 300. During a program operation, the memory controller 200 may provide a program command, an address, and data to the memory device 100. During a read operation, the memory controller 200 may provide a read command and an address to the memory device 100. During an erase operation, the memory controller 200 may provide an erase command and an address to the memory device 100.

In an embodiment, the memory controller 200 may autonomously generate a program command, an address, and data without receiving a request from the host, and transmit them to the memory device 100. For example, the memory controller 200 may provide commands, addresses, and data to the memory device 100 to perform a background operation, such as a wear leveling or a garbage collection operation.

The memory controller 200 may run firmware (FW) for controlling the memory device 100. For example, the memory device 100 may be a flash memory device, and the memory controller 200 may operate firmware such as a Flash Translation Layer (FTL) for controlling communication between the host 300 and the flash memory device 100. For example, one of the functions of the firmware such as an FTL may be to enable the memory controller 200 to convert a logical address included in a request received from the host 300 into a physical address which is an address ADD to be provided to the memory device 100 and which corresponds to a memory region of the memory device 100.

The memory controller 200 according to an embodiment of the present disclosure may include a device lock control unit 210.

The device lock control unit 210 controls the operation of the storage device 50 based on the movement of the storage device 50 in order to prevent damage and or loss of data due to the movement.

In operation, the device lock control unit 210 can protect data stored in the storage device 50 or in the memory device 100 included in the storage device 50, and secure the operation stability of the storage device 50. The device lock control unit 210 in conjunction with the sensor unit 220 can perform a device lock operation which may include collecting information about a physical movement of the storage device 50, and preventing or interrupting the execution of a request or command received from the host 300 when a physical movement of the storage device 50 above an acceptable movement threshold is detected.

The device lock operation may be activated or deactivated depending on whether or not a device lock mode is enabled. That is, the device lock operation may be activated when the device lock mode is enabled, and may not be activated when the device lock mode is disabled.

The enabling or disabling of the device lock mode may be changed according to the control of the host.

For example, the host 300 may provide a command to the device lock control unit 210 of the memory controller 200 instructing the device lock mode to be enabled. In an embodiment, the command for instructing the device lock mode to be enabled may be provided using a set feature command. The set feature command may be a command for changing the value of a register in which device lock mode information is stored. The register may be included in the memory controller 200. When the set feature command for instructing the device lock mode to be enabled is inputted from the host 300, the device lock mode may be changed to enabled status.

In an embodiment, a set feature command including instructions for the memory controller 200 to enable the device lock mode may be provided by the host 300 to the memory controller 200. A password may be included in the set feature command to be used for enabling the device lock mode. The device lock control unit 210 may store the password provided from the host 300.

The host 300 may provide a command to the device lock control unit 210 of the memory controller 200 instructing the device lock mode to be disabled. The command for instructing the device lock mode to be disabled may be a set feature command. When a set feature command for instructing the device lock mode to be disabled is inputted from the host 300, the device lock mode may be changed to a disabled mode.

The memory controller 200 may operate the storage device 50 in an enabled or a disabled device lock mode depending upon a command received from the host 300.

For example, when the device lock mode is enabled, the device lock control unit 210 may lock the storage device 50 when physical movement of the storage device 50 above an acceptable movement threshold is detected such that execution of any request or command received from the host 300 is interrupted or ignored. In contrast, when the device lock mode is disabled, the device lock control unit 210 does not lock the storage device 50 even when physical movement of the storage device 50 above an acceptable movement threshold is detected.

While the storage device 50 is locked, the memory controller 200 may output an abort signal to the host 300 without executing any request or command provided from the host 300.

The locked storage device 50 can be unlocked in response to a command provided from the host 300 for instructing the locked storage device 50 to be unlocked. Here, the host 300 may simultaneously or sequentially provide the command for instructing the storage device 50 to be unlocked and the password to be used to unlock the storage device 50 to the memory controller 200.

For example, the device lock control unit 210 may unlock the locked storage device 50 when the password provided from the host matches a password stored when the device lock mode is enabled.

The detailed operation of the device lock control unit 210 will be described in detail later with reference to FIG. 2.

The sensor unit 220 may collect information about physical movement of the storage device 50. Although the sensor unit 220 is illustrated as being located outside the memory controller 200 in FIG. 1, the sensor unit 220 may be included in the memory controller 200 in other embodiments.

The sensor unit 220 may include one or more sensors for collecting information about the physical movement of the storage device 50. This information may be use by the memory controller for detecting the physical movement of the storage device 50 and for determining whether or not the detected movement is above an acceptable movement threshold. Alternatively, the sensor unit may detect the physical movement of the storage device 50 directly, compare it with an acceptable movement threshold and provide a lock signal to the movement lock control unit when the detected movement is in excess of the acceptable movement threshold. In an embodiment, the one or more sensors included in the sensor unit 220 may include an acceleration sensor, a gravitational sensor, a terrestrial magnetism sensor or a gyroscope sensor.

The sensor unit 220 may provide sensor values related to physical movement, which are collected from the one or more sensors included in the sensor unit 220, to the memory controller 200. In various embodiments, the sensor values measured by the sensor unit 220 may be inputted to the memory controller 200 through a General-Purpose Input/Output (GPIO) port of the memory controller 200.

The host 300 may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
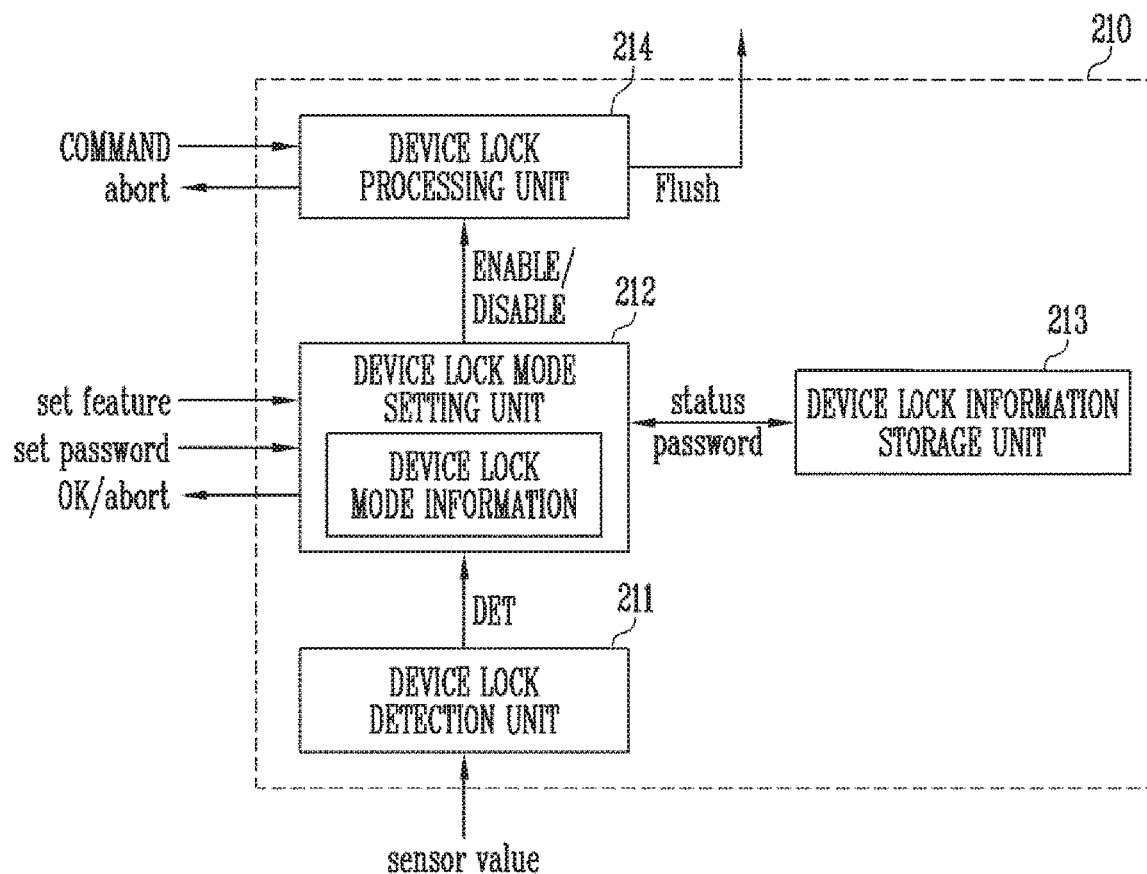
FIG. 2 is a block diagram illustrating an exemplary configuration of a device lock control unit employed in the storage device shown in FIG. 1.

FIG. 2 is a block diagram illustrating an exemplary configuration of the device lock control unit 210 of FIG. 1 and an exemplary operation thereof.

Referring to FIG. 2, the device lock control unit 210 may include a device lock detection unit 211, a device lock mode setting unit 212, a device lock information storage unit 213, and a device lock processing unit 214.

The device lock detection unit 211 may receive the sensor values from the sensor unit 220. The sensor unit 220 may output the sensor values to the device lock control unit 210 regardless of the control of the device lock control unit 210, and the device lock detection unit 211 may acquire sensor values periodically or randomly under the control of the device lock control unit 210.

The device lock detection unit 211 may compare each sensor value with a preset acceptable movement threshold TH, and may output a detection signal DET to the device lock mode setting unit 212 when the sensor value exceeds the preset acceptable movement threshold TH.

The device lock mode setting unit 212 may control enabling or disabling of a device lock operation. In detail, the device lock mode setting unit 212 may receive from the host 300 a command for instructing a device lock mode to be enabled or a command for instructing the device lock mode to be disabled. In an embodiment, the command for instructing the device lock mode to be enabled or the command for instructing the device lock mode to be disabled may be a set feature command.

When the set feature command for instructing the device lock mode to be enabled is received, the device lock mode setting unit 212 may change the value of a register in which device lock mode information is stored to indicate the enabled status of the device lock mode. Alternatively, when the set feature command for instructing the device lock mode to be disabled is received, the device lock mode setting unit 212 may change the value of the register in which device lock mode information is stored to indicate the disabled status of the device lock mode.

After the set feature command for instructing the device lock mode to be enabled is received from the host 300, the device lock mode setting unit 212 may additionally receive a password to be used to unlock the locked storage device 50. In various embodiments, the password may be provided to the device lock mode setting unit 212, with the password being included in the set feature command for instructing the device lock mode to be enabled.

The device lock mode setting unit 212 may store the received password in the device lock information storage unit 213.

The device lock mode setting unit 212 may change the value of the register, in which the device lock mode information is stored, to indicate the enabled status or disabled status of the device lock mode in response to the set feature command provided from the host 300, that is, the set feature command for instructing the device lock mode to be enabled or the set feature command for instructing the device lock mode to be disabled. The device lock mode setting unit 212 may output a set success signal to the host 300 if the device lock mode has been successfully enabled or disabled in response to the set feature command provided from the host 300, that is, the set feature command for instructing the device lock mode to be enabled or the set feature command for instructing the device lock mode to be disabled, and may output a set failure signal to the host 300 if the setting of the device lock mode has failed.

In an embodiment, when the device lock mode is enabled, the device lock mode setting unit 212 may lock the storage device 50 if the detection signal DET is provided from the device lock detection unit 211. When the device lock mode is disabled, the device lock mode setting unit 212 cannot lock the storage device 50 even when the detection signal DET is received.

When the device lock mode is in enabled status, and the detection signal DET is inputted from the device lock detection unit 211, the device lock mode setting unit 212 locks the storage device 50, and stores information (e.g., a password) about the locked status of the storage device 50 in the device lock information storage unit 213.

When the storage device 50 is locked, the device lock mode setting unit 212 may provide an enable signal ENABLE indicating the locked status of the storage device 50 to the device lock processing unit 214.

In an embodiment, the device lock mode setting unit 212 may receive a command for instructing the locked storage device 50 to be unlocked from the host 300. Here, the command for instructing the locked storage device 50 to be unlocked and a password may be simultaneously or sequentially received. The command for instructing the locked storage device 50 to be unlocked may be a set feature command.

When the command for instructing the storage device 50 to be unlocked is received from the host 300, the device lock mode setting unit 212 may compare the password, received simultaneously or sequentially with the command from the host 300, with a password stored in the device lock information storage unit 213. The device lock mode setting unit 212 may unlock the locked storage device 50 based on the result of comparison between the password, received simultaneously or sequentially with the command from the host, with the password stored in the device lock information storage unit 213. When the locked storage device 50 becomes unlocked, the device lock mode setting unit 212 may store information about the unlocked status of the storage device 50 in the device lock information storage unit 213. When the locked storage device 50 becomes unlocked, the device lock mode setting unit 212 may provide a disable signal DISABLE indicating the unlocked status of the storage device 50 to the device lock processing unit 214.

The device lock information storage unit 213 may store information about the locked status or unlocked status of the storage device 50. The device lock information storage unit 213 may store the password received simultaneously or sequentially with the command for instructing the device lock mode to be enabled. In an embodiment, the device lock information storage unit 213 may be a nonvolatile memory. Alternatively, the device lock information storage unit 213 may indicate a specific region in the memory device 100 for storing information about the locked status or unlocked status of the storage device 50.

The device lock processing unit 214 may receive the enable signal ENABLE indicating that the storage device 50 is in locked status or the disable signal DISABLE indicating that the storage device 50 is in unlocked status. When a command COMMAND for accessing the memory device 100 is received from the host 300 while the device lock mode is in the enabled status ENABLE, the device lock processing unit 214 outputs an abort signal to the host 300 without executing the received command. When a command COMMAND for accessing the memory device is received from the host 300 while the device lock mode is in the disabled status DISABLE, the device lock processing unit 214 executes the received command.

In an embodiment, when the enable signal indicating that the storage device 50 is in locked status is inputted, the device lock processing unit 214 may perform an operation corresponding to the command previously provided from the host 300 or a flush operation of storing data, buffered in a write cache buffer included in the memory controller, in the memory device 100. However, even in this case, the device lock processing unit 214 may not execute a command relating to accessing the memory device 100, which is inputted from the host 300, after the enable signal ENABLE indicating that the storage device 50 is in locked status has been inputted.

In various embodiments, the command COMMAND related to accessing the memory device 100 may be a write command or a read command.

Figure 3:
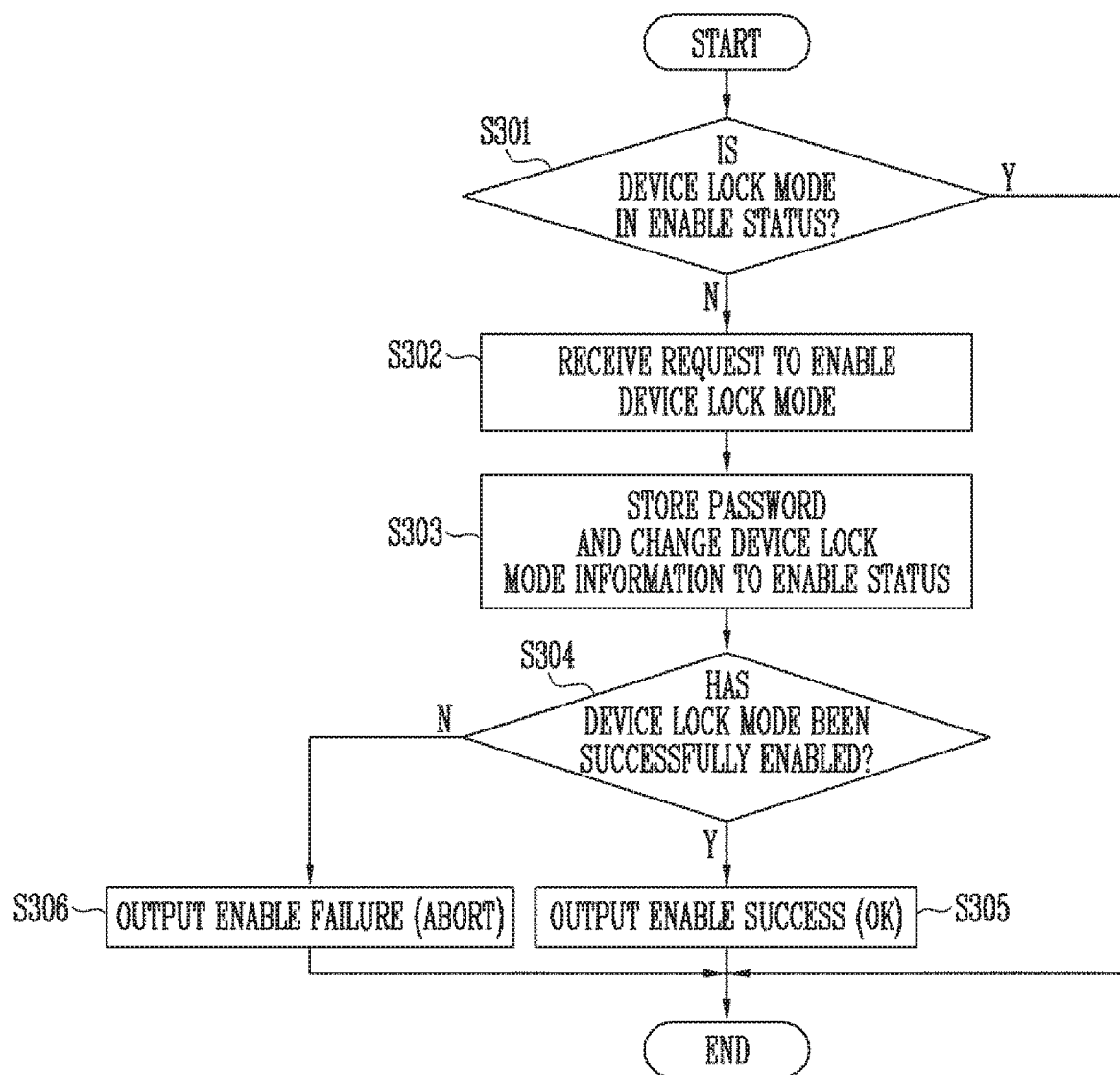
FIG. 3 is a flowchart illustrating the operation of a memory controller according to an embodiment of the present disclosure.

FIG. 3 is a flowchart illustrating an exemplary operation of the memory controller 200 according to an embodiment of the present disclosure. FIG. 3 illustrates the operation of the memory controller 200 that sets the device lock mode to enabled status.

Referring to FIG. 3, the memory controller 200 may determine whether the device lock mode is in enabled status at step S301. When the device lock mode is in enabled status, the memory controller 200 terminates the operation of setting the device lock mode to enabled status, whereas when the device lock mode is in disabled status, the memory controller proceeds to step S302.

At step S302, the memory controller 200 may receive a request to enable the device lock mode from the host 300. In detail, the memory controller 200 may receive a command for instructing the device lock mode to be enabled. In an embodiment, the command for instructing the device lock mode to be enabled may be a set feature command. In various embodiments, the memory controller 200 may receive a password simultaneously or sequentially with the command for instructing the device lock mode to be enabled.

At step S303, the memory controller 200 may store the password, and may change the value of a register, in which device lock mode information is stored, to indicate the enabled status of the device lock mode.

At step S304, the memory controller 200 may determine whether the device lock mode has been successfully enabled. If it is determined that the device lock mode has been successfully enabled, the memory controller 200 may proceed to step S305, otherwise the memory controller 200 may proceed to step S306.

At step S305, the memory controller 200 may output an enable success signal to the host 300.

At step S306, the memory controller 200 may output an enable failure signal to the host 300.

Figure 4:
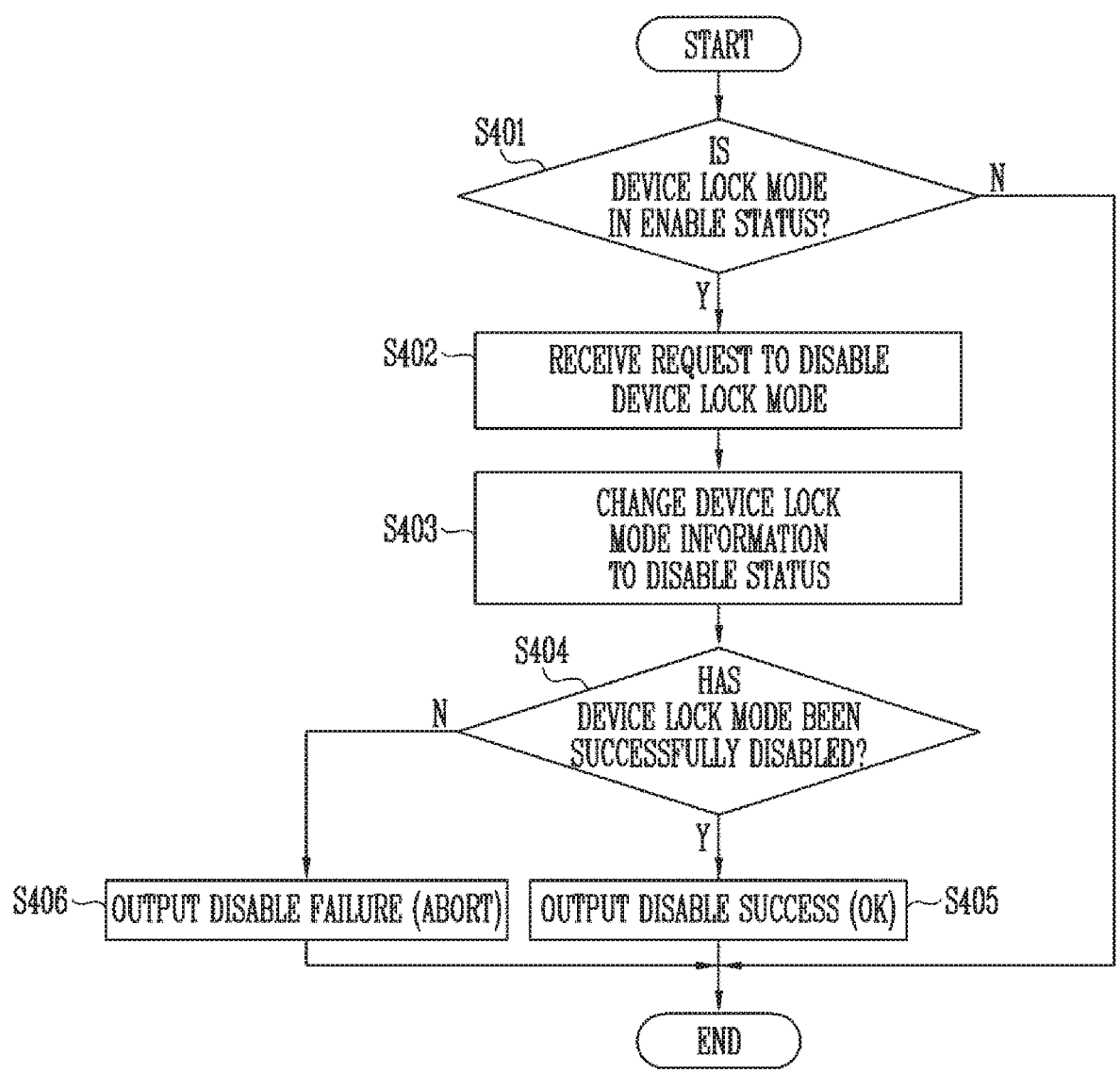
FIG. 4 is a flowchart illustrating the operation of the memory controller according to an embodiment of the present disclosure.

FIG. 4 is a flowchart illustrating the operation of the memory controller 200 according to an embodiment of the present disclosure. FIG. 4 illustrates the operation of the memory controller 200 that sets the device lock mode to disabled status.

Referring to FIG. 4, the memory controller 200 may determine whether the device lock mode is in enabled status at step S401. When the device lock mode is in enabled status, the memory controller 200 may proceed to step S402, whereas when the device lock mode is in disabled status, the memory controller 200 may terminate the operation of setting the device lock mode to disabled status.

At step S402, the memory controller 200 may receive a request to disable the device lock mode from the host 300. In detail, the memory controller 200 may receive a command for instructing the device lock mode to be disabled. In an embodiment, the command for instructing the device lock mode to be disabled may be a set feature command.

At step S403, the memory controller 200 may store the password, and may change the value of a register, in which device lock mode information is stored, to indicate the disabled status of the device lock mode.

At step S404, the memory controller 200 may determine whether the device lock mode has been successfully disabled. If it is determined that the device lock mode has been successfully disabled, the memory controller 200 may proceed to step S405, otherwise the memory controller 200 may proceed to step S406.

At step S405, the memory controller 200 may output a disable success signal to the host 300.

At step S406, the memory controller 200 may output a disable failure signal to the host 300.

Figure 5:
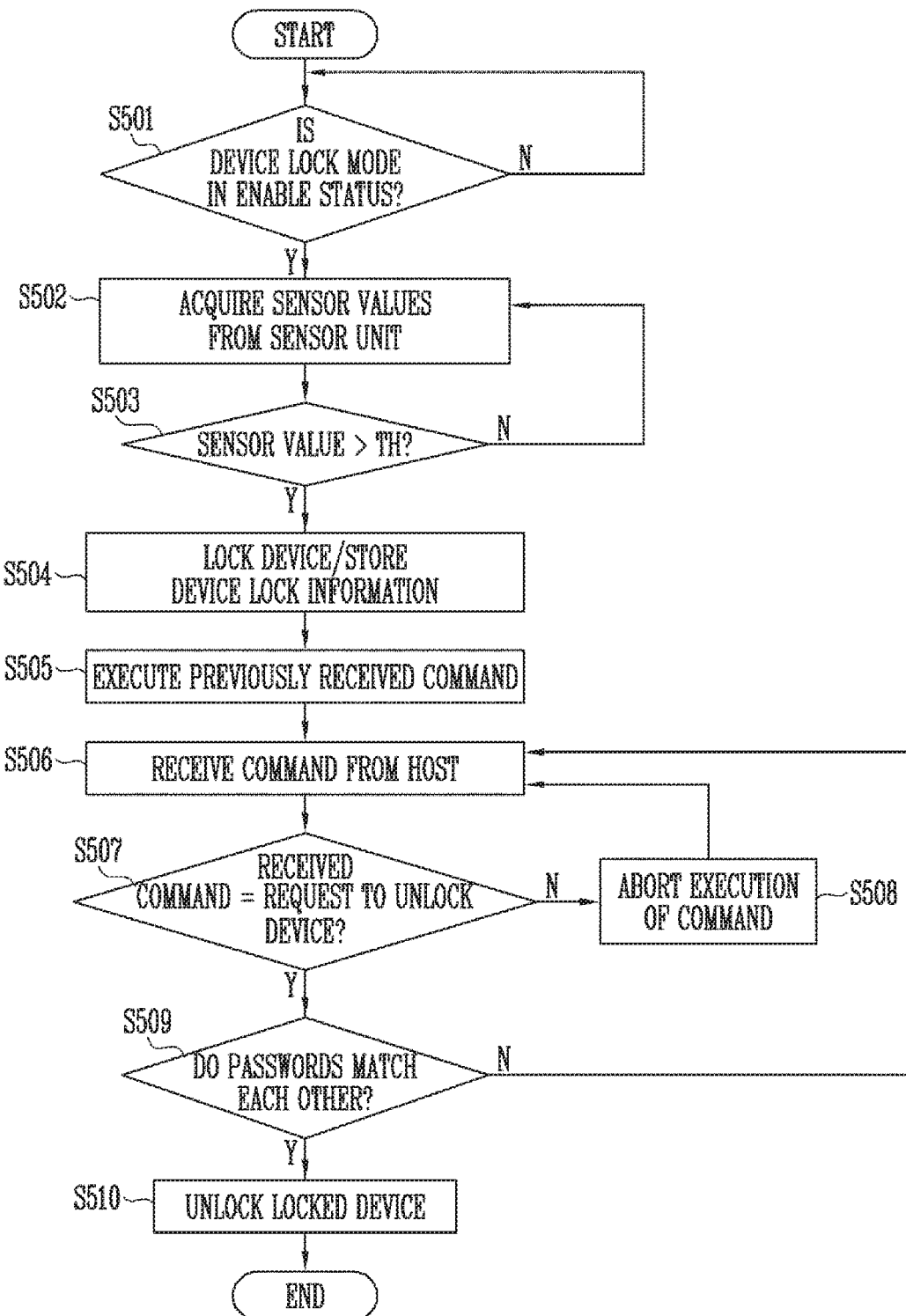
FIG. 5 is a flowchart illustrating the operation of the memory controller according to an embodiment of the present disclosure.

FIG. 5 is a flowchart illustrating the operation of the memory controller 200 according to an embodiment of the present disclosure.

FIG. 5 illustrates the operation of the memory controller 200 which locks or unlocks the storage device 50 when a device lock mode is in enabled status.

Referring to FIG. 5, the memory controller 200 may determine whether a device lock mode is in enabled status at step S501. When the device lock mode is in enabled status, the memory controller 200 may proceed to step S502.

At step S502, the memory controller 200 may acquire sensor values from a sensor unit 220. The sensor values may represent detected physical movement of the storage device 50. In detail, the sensor unit 220 may collect information about physical movement of the storage device 50. In an embodiment, the sensor unit 220 may include one or more sensors for collecting information about the physical movement of the storage device 50. The one or more sensors included in the sensor unit 220 may include an acceleration sensor, a gravitational sensor, a terrestrial magnetism sensor or a gyroscope sensor. In various embodiments, the memory controller 200 may acquire the sensor values measured by the sensor unit 220 through a General-Purpose Input/Output (GPIO) port.

At step S503, the memory controller 200 may compare each sensor value with a preset acceptable movement threshold TH, and may determine whether the sensor value exceeds the preset acceptable movement threshold TH. If the sensor value exceeds the acceptable movement threshold TH, the memory controller 200 may proceed to step S504, whereas if the sensor value does not exceed the acceptable movement threshold TH, the memory controller 200 may return to step S502 at intervals of a preset time and may then acquire sensor values.

At step S504, the memory controller 200 may lock the storage device 50. In detail, the memory controller 200 may lock the storage device 50 and may store information about the locked status of the storage device 50 as device lock information. In an embodiment, the memory controller 200 may store the device lock information indicating the locked status of the storage device 50, either in a nonvolatile memory included in the memory controller 200 or in a memory region of the memory device 100 controlled by the memory controller 200.

At step S505, the memory controller 200 may perform an operation corresponding to the command previously provided from the host 300. In an embodiment, the memory controller 200 may perform a flush operation of storing data, buffered in a write cache buffer included in the memory controller 200, in the memory device 100. In various embodiments, step S505 may be omitted.

At step S506, the memory controller 200 may receive a command from the host 300.

At step S507, the memory controller 200 may determine whether the received command is a command instructing the locked storage device 50 to be unlocked. When the command provided from the host 300 is not a command instructing the locked storage device 50 to be unlocked, the received command may be a command related to accessing the memory device 100. In an embodiment, the command related to accessing the memory device 100 may be or correspond to a write command or a read command. When the received command is instructing the locked storage device 50 to be unlocked, the memory controller 200 may proceed to step S509, whereas when the received command is not instructing the locked storage device 50 to be unlocked, the memory controller 200 may proceed to step S508.

At step S508, the memory controller 200 aborts the execution of the received command without executing the command. Here, the memory controller 200 outputs an abort signal to the host 300.

At step S509, the memory controller 200 may determine whether a password, received simultaneously or sequentially with the command instructing the locked storage device 50 to be unlocked at step S507, matches a previously stored password. If it is determined that the received password matches the previously stored password, the memory controller 200 may proceed to step S510, whereas if it is determined that the received password does not match the previously stored password, the memory controller 200 may return to step S506.

At step S510, the memory controller 200 may unlock the locked storage device 50. In this case, information about the unlocked status of the storage device 50 may be stored as device lock information.

Figure 6:
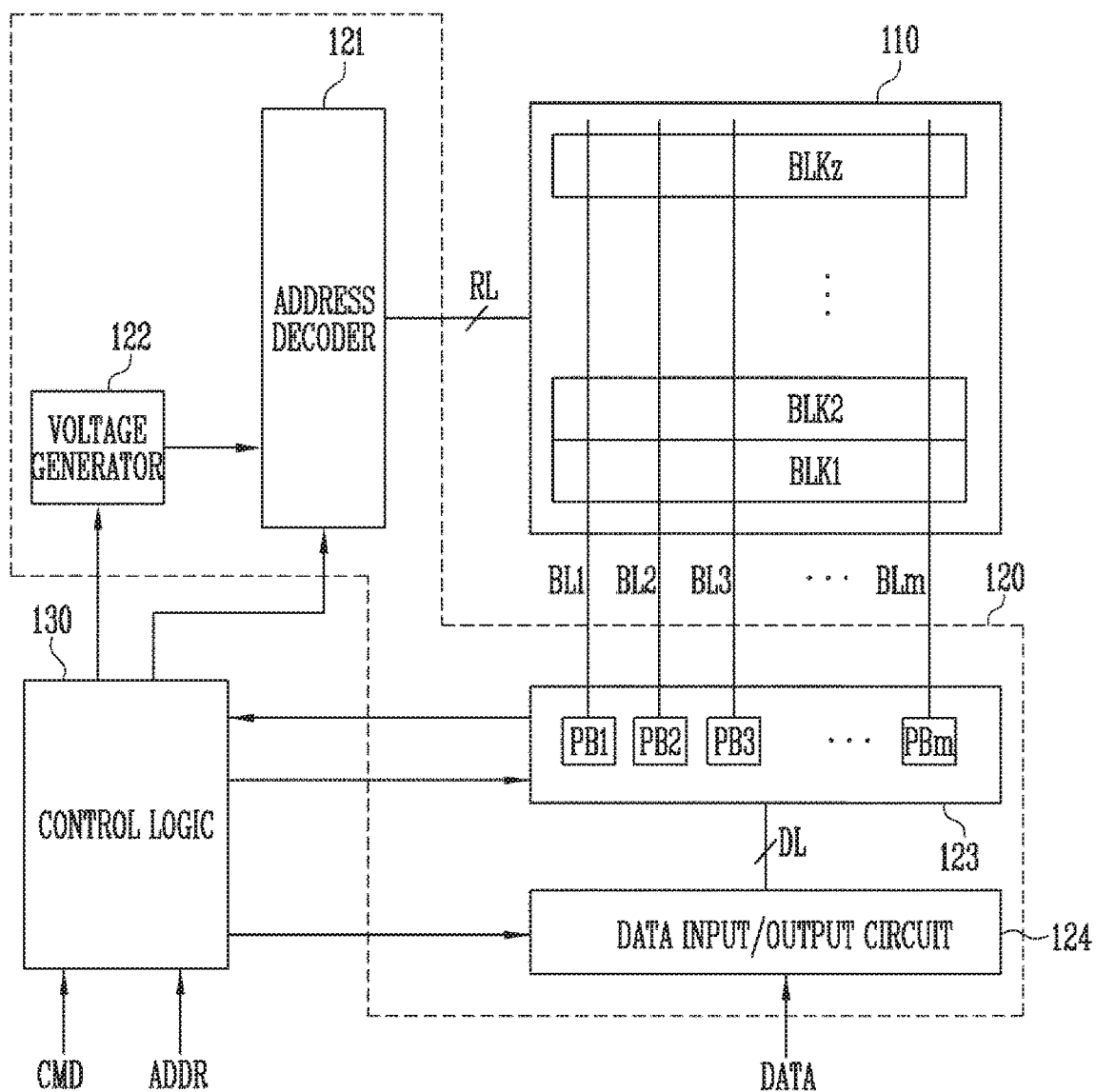
FIG. 6 is a diagram illustrating an exemplary structure of a memory device employed in the storage device shown in FIG. 1.

FIG. 6 is a diagram illustrating an exemplary structure of the memory device 100 of FIG. 1.

Referring to FIG. 6, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are coupled to an address decoder 121 through row lines RL. The memory blocks BLK1 to BLKz are coupled to a read and write circuit 123 through bit lines BL1 to BLm. Each of the memory blocks BLK1 to BLKz includes a plurality of memory cells. In an embodiment, the plurality of memory cells are nonvolatile memory cells. In the plurality of memory cells, memory cells coupled to the same word line may be referred to as a single page. That is, the memory cell array 110 may be composed of a plurality of pages. In an embodiment, each of the plurality of memory blocks BLK1 to BLKz included in the memory cell array 110 may also include a plurality of dummy cells. One or more dummy cells may be coupled in series between a drain select transistor and the memory cells and between a source select transistor and the memory cells.

The memory cells of the memory device 100 may each be implemented as a single-level cell (SLC) capable of storing a single data bit, a multi-level cell (MLC) capable of storing two or more data bits, such as a triple-level cell (TLC) capable of storing three data bits, or a quad-level cell (QLC) capable of storing four data bits.

The peripheral circuit 120 may include an address decoder 121, a voltage generator 122, the read and write circuit 123, and a data input/output circuit 124.

The peripheral circuit 120 may drive the memory cell array 110. For example, the peripheral circuit 120 may drive the memory cell array 110 so that a program operation, a read operation, and an erase operation are performed.

The address decoder 121 is coupled to the memory cell array 110 through row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 is configured to operate under the control of the control logic 130. The address decoder 121 receives the address ADDR from the control logic 130.

The address decoder 121 may be configured to decode a block address of the received address ADDR. The address decoder 121 may select at least one memory block from among the memory blocks BLK1 to BLKz in response to the decoded block address. The address decoder 121 may be configured to decode a row address of the received address ADDR. The address decoder 121 may select at least one word line of the selected memory block by applying voltages supplied from the voltage generator 122 to at least one word line WL in response to the decoded row address.

During a program operation, the address decoder 121 may apply a program voltage to the selected word line and apply a pass voltage having a level lower than that of the program voltage to unselected word lines. During a program verify operation, the address decoder 121 may apply a verify voltage to a selected word line and apply a verification pass voltage higher than the verify voltage to unselected word lines.

During a read operation, the address decoder 121 may apply a read voltage to a selected word line and apply a read pass voltage higher than the read voltage to unselected word lines.

In an embodiment, the erase operation of the memory device 100 may be performed on a memory block basis. During an erase operation, the address ADDR input to the memory device 100 may include a block address. The address decoder 121 may decode the block address and select a single memory block in response to the decoded block address. During the erase operation, the address decoder 121 may apply a ground voltage to word lines coupled to the selected memory block.

In an embodiment, the address decoder 121 may be configured to decode a column address of the received address ADDR. A decoded column address DCA may be transferred to the read and write circuit 123. In an exemplary embodiment, the address decoder 121 may include components such as a row decoder, a column decoder, and an address buffer.

The voltage generator 122 is configured to generate a plurality of voltages using an external supply voltage provided to the memory device 100. The voltage generator 122 is operated under the control of the control logic 130.

In an embodiment, the voltage generator 122 may generate an internal supply voltage by regulating the external supply voltage. The internal supply voltage generated by the voltage generator 122 is used as an operating voltage of the memory device 100.

In an embodiment, the voltage generator 122 may generate a plurality of voltages using an external supply voltage or an internal supply voltage. The voltage generator 122 may be configured to generate various voltages required by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors for receiving the internal supply voltage in order to generate a plurality of voltages having various voltage levels, and may generate a plurality of voltages by selectively activating the pumping capacitors under the control of the control logic 130.

The generated voltages may be supplied to the memory cell array 110 by the address decoder 121.

The read and write circuit 123 includes first to m-th page buffers PB1 to PBm. The first to m-th page buffers PB1 to PBm are coupled to the memory cell array 110 through first to m-th bit lines BL1 to BLm, respectively. The first to m-th page buffers PB1 to PBm are operated under the control of the control logic 130.

The first to m-th page buffers PB1 to PBm perform data communication with the data input/output circuit 124. During a program operation, the first to m-th page buffers PB1 to PBm receive data to be stored DATA through the data input/output circuit 124 and data lines DL.

During a program operation, the first to m-th page buffers PB1 to PBm may transfer the data DATA, received through the data input/output circuit 124, to selected memory cells through the bit lines BL1 to BLm when a program pulse is applied to each selected word line. The memory cells in the selected page are programmed based on the transferred data DATA. Memory cells coupled to a bit line to which a program permission voltage (e.g. a ground voltage) is applied may have increased threshold voltages. Threshold voltages of memory cells coupled to a bit line to which a program prohibition voltage (e.g. a supply voltage) is applied may be maintained. During a program verify operation, the first to m-th page buffers may read data, in which the threshold voltages of memory cells are stored as verify voltages, from the selected memory cells through the bit lines BL1 to BLm.

During a read operation, the read and write circuit 123 reads data DATA from the memory cells in the selected page through the bit lines BL, and outputs the read data DATA to the data input/output circuit 124.

During an erase operation, the read and write circuit 123 may allow the bit lines BL to float. In an embodiment, the read and write circuit 123 may include a column select circuit.

The data input/output circuit 124 is coupled to the first to m-th page buffers PB1 to PBm through the data lines DL. The data input/output circuit 124 is operated under the control of the control logic 130.

The data input/output circuit 124 may include a plurality of input/output buffers (not illustrated) for receiving input data. During a program operation, the data input/output circuit 124 receives data to be stored DATA from an external controller (not shown). During a read operation, the data input/output circuit 124 outputs the data, provided from the first to m-th page buffers PB1 to PBm included in the read and write circuit 123, to the external controller.

The control logic 130 may be coupled to the address decoder 121, the voltage generator 122, the read and write circuit 123, and the data input/output circuit 124. The control logic 130 may control the overall operation of the memory device 100. The control logic 130 may be operated in response to a command CMD received from an external device.

Figure 7:
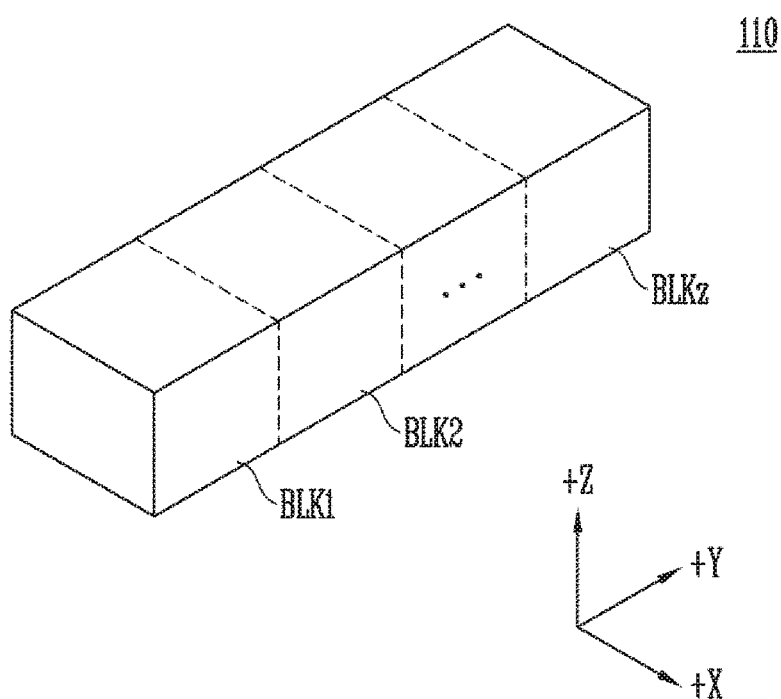
FIG. 7 is a diagram illustrating an exemplary embodiment of a memory cell array shown in FIG. 6.

FIG. 7 is a diagram illustrating an embodiment of the memory cell array of FIG. 6.

Referring to FIG. 7, the memory cell array 110 includes a plurality of memory blocks BLK1 to BLKz. Each memory block has a three-dimensional (3D) structure. Each memory block includes a plurality of memory cells stacked on a substrate. Such memory cells are arranged along a positive X (+X) direction, a positive Y (+Y) direction, and a positive Z (+Z) direction. Exemplary memory block structures will be described in detail below with reference to FIGS. 8 and 9.

Figure 8:
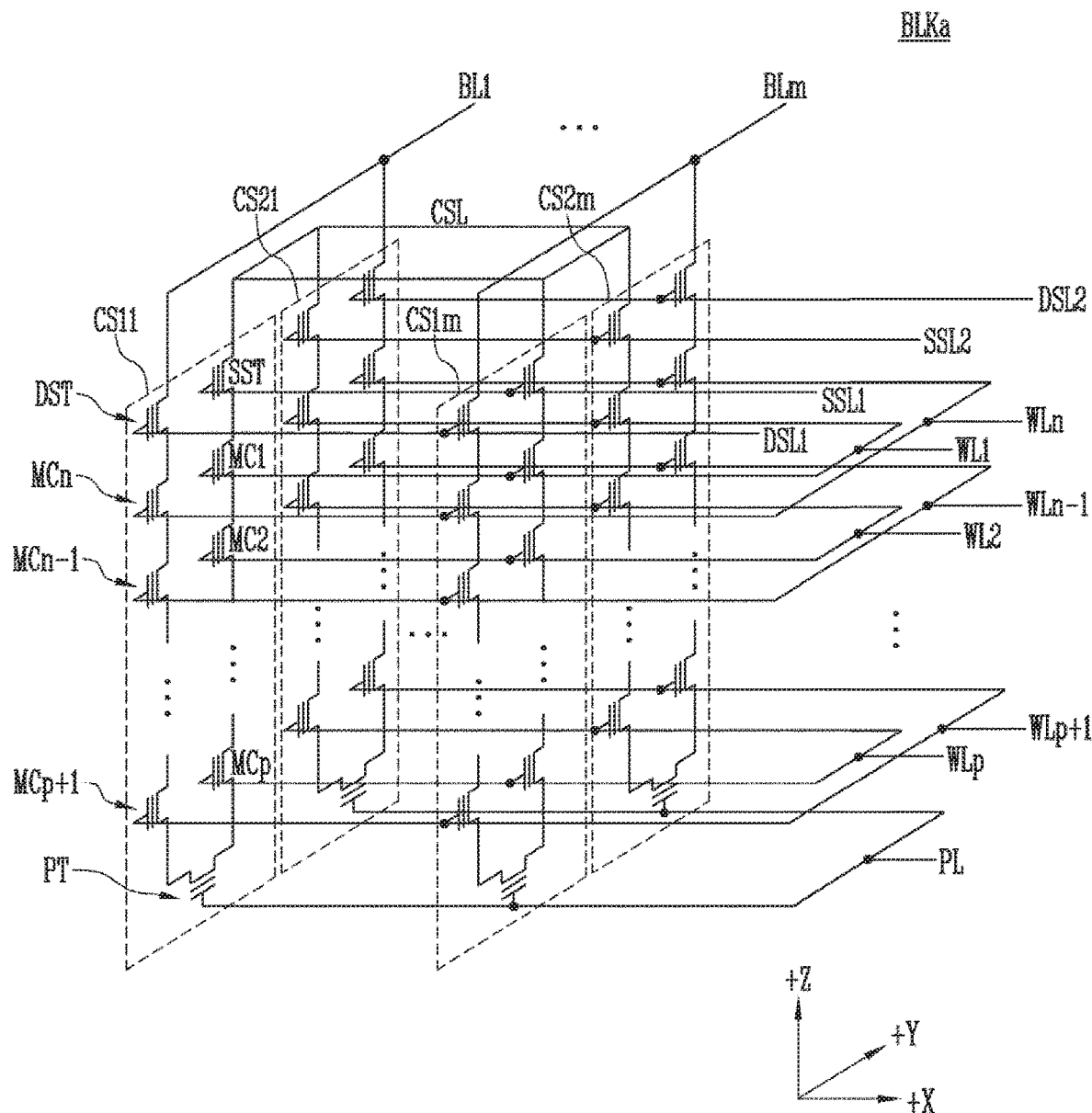
FIG. 8 is a circuit diagram illustrating an exemplary configuration of any one memory block BLKa of memory blocks BLK1 to BLKz shown in FIG. 7.

FIG. 8 is a circuit diagram illustrating an exemplary configuration of any one memory block BLKa of the memory blocks BLK1 to BLKz of FIG. 7.

Referring to FIG. 8, the memory block BLKa includes a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings are arranged in a row direction (i.e. a positive (+) X direction). In FIG. 8, two cell strings are shown as being arranged in a column direction (i.e. a positive (+) Y direction). However, this illustration is made for convenience of description, and it will be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are coupled to a source select line extended in a row direction, and source select transistors of cell strings arranged in different rows are coupled to different source select lines. In FIG. 8, source select transistors of cell strings CS11 to CS1m in a first row are coupled to a first source select line SSL1. The source select transistors of cell strings CS21 to CS2m in a second row are coupled to a second source select line SSL2.

In an embodiment, source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a positive (+) Z direction and are connected in series between the source select transistor SST and the pipe transistor PT. The p+1-th to n-th memory cells MCp+1 to MCn are sequentially arranged in the +Z direction and are connected in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

The gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extended in a row direction. Drain select transistors of cell strings CS11 to CS1m in the first row are coupled to a first drain select line DSL1. Drain select transistors of cell strings CS21 to CS2m in a second row are coupled to a second drain select line DSL2.

Cell strings arranged in a column direction are coupled to bit lines extended in a column direction. In FIG. 4, cell strings CS11 and CS21 in a first column are coupled to a first bit line BL1. Cell strings CS1m and CS2m in an m-th column are coupled to an m-th bit line BLm.

The memory cells coupled to the same word line in cell strings arranged in a row direction constitute a single page. For example, memory cells coupled to the first word line WL1, among the cell strings CS11 to CS1m in the first row, constitute a single page. Memory cells coupled to the first word line WL1, among the cell strings CS21 to CS2m in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

In an embodiment, even bit lines and odd bit lines, instead of first to m-th bit lines BL1 to BLm, may be provided. Further, even-numbered cell strings, among the cell strings CS11 to CS1m or CS21 to CS2m arranged in a row direction, may be coupled to the even bit lines, respectively, and odd-numbered cell strings, among the cell strings CS11 to CS1m or CS21 to CS2m arranged in the row direction, may be coupled to the odd bit lines, respectively.

In an embodiment, one or more of the first to n-th memory cells MC1 to MCn may be used as dummy memory cells. For example, one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer memory cells are provided, the size of the memory block BLKa is reduced, but the reliability of the operation of the memory block BLKa may be deteriorated.

In order to efficiently control the one or more dummy memory cells, each of the dummy memory cells may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 9:
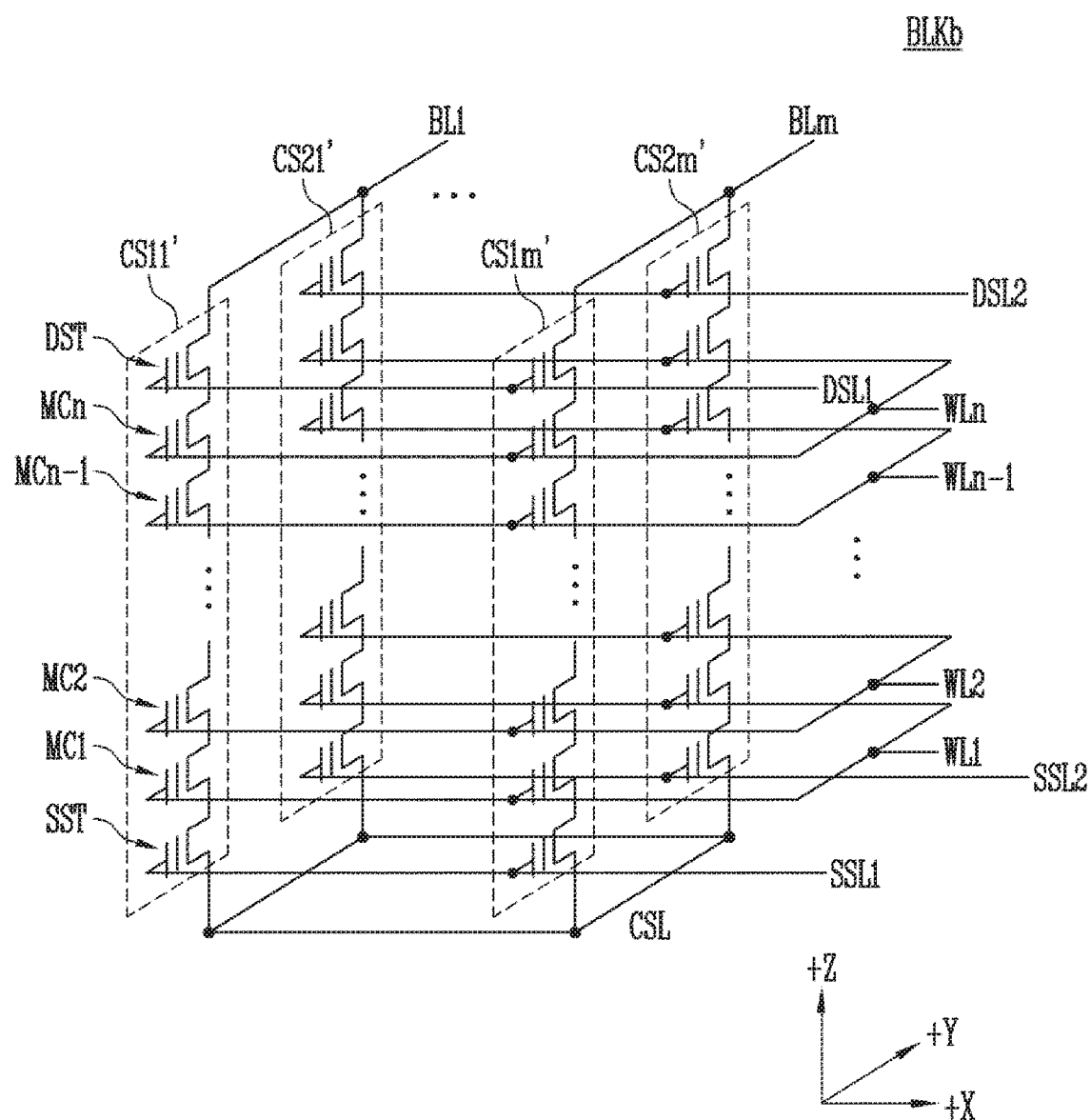
FIG. 9 is a circuit diagram illustrating an exemplary configuration of any one memory block BLKb of the memory blocks BLK1 to BLKz shown in FIG. 7.

FIG. 9 is a circuit diagram illustrating an example of any one memory block BLKb of the memory blocks BLK1 to BLKz of FIG. 7.

Referring to FIG. 9, the memory block BLKb includes a plurality of cell strings CS11' to CS1m' and CS21' to CS2m'. Each of the plurality of cell strings CS11' to CS1m' and CS21' to CS2m' is extended along a positive Z (+Z) direction. Each of the cell strings CS11' to CS1m' and CS21' to CS2m' includes at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extended in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLKb of FIG. 9 has an equivalent circuit similar to that of the memory block BLKa of FIG. 8 except that a pipe transistor PT is excluded from each cell string.

In an embodiment, even bit lines and odd bit lines, instead of first to m-th bit lines BL1 to BLm, may be provided. Further, even-numbered cell strings, among the cell strings CS11' to CS1m' or CS21' to CS2m' arranged in a row direction, may be coupled to the even bit lines, respectively, and odd-numbered cell strings, among the cell strings CS11' to CS1m' or CS21' to CS2m' arranged in the row direction, may be coupled to the odd bit lines, respectively.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As more dummy memory cells are provided, the reliability of the operation of the memory block BLKb is improved, but the size of the memory block BLKb is increased. As fewer memory cells are provided, the size of the memory block BLKb is reduced, but the reliability of the operation of the memory block BLKb may be deteriorated.

In order to efficiently control the one or more dummy memory cells, each of the dummy memory cells may have a required threshold voltage. Before or after the erase operation of the memory block BLKb is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 10:
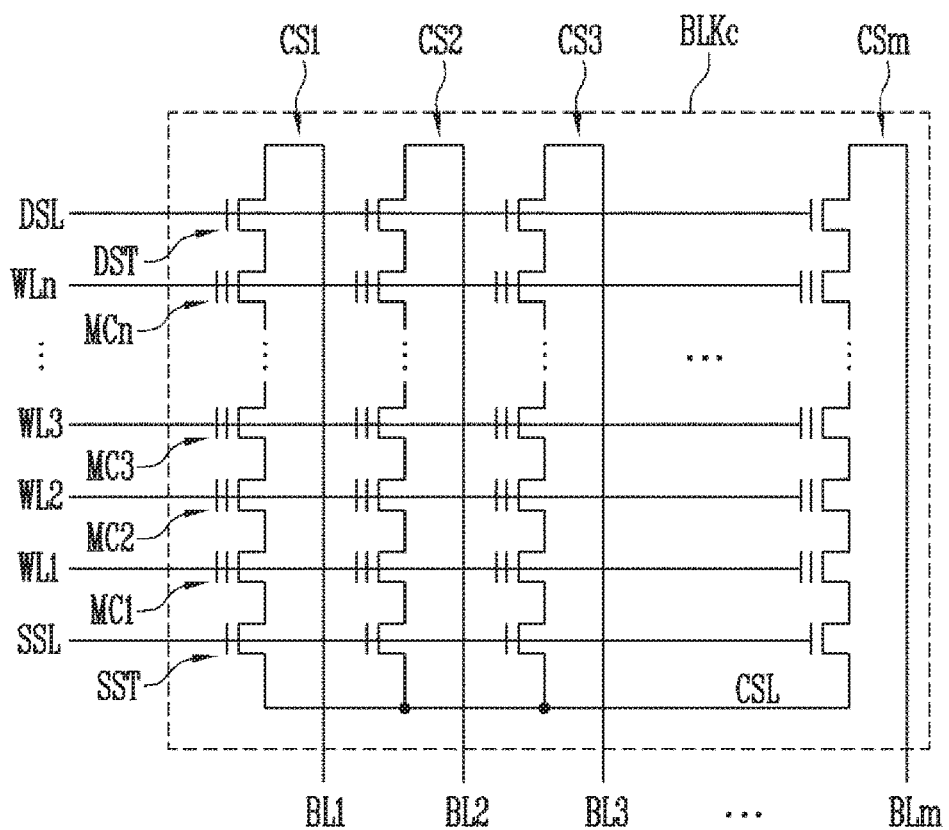
FIG. 10 is a circuit diagram illustrating an embodiment of the memory cell array shown in FIG. 6.

FIG. 10 is a circuit diagram showing an embodiment of the memory cell array of FIG. 6.

Referring to FIG. 10, the memory cell array may have a two-dimensional (2D) planar structure, not the 3D structure described above with reference to FIGS. 7 to 9.

In FIG. 10, a memory block BLKc includes a plurality of cell strings CS1 to CSm. The plurality of cell strings CS1 to CSm may be coupled to a plurality of bit lines BL1 to BLm, respectively. Each of the cell strings CS1 to CSm includes at least one source select transistor SST, first to n-th memory cells MC1 to MCn, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and the memory cells MC1 to MCn.

The first to n-th memory cells MC1 to MCn in each cell string are coupled between the source select transistor SST and the drain select transistor DST.

The drain select transistor DST of each cell string is coupled between the corresponding bit line and the memory cells MC1 to MCn.

The memory cells coupled to the same word line may constitute a single page. The cell strings CS1 to CSm may be selected by selecting the drain select line DSL. One page may be selected from the selected cell strings by selecting any one of the word lines WL1 to WLn.

In other embodiments, even bit lines and odd bit lines may be provided instead of the first to m-th bit lines BL1 to BLm. Among the cell strings CS1 to CSm, even-numbered cell strings may be coupled to the even bit lines, respectively, and odd-numbered cell strings may be coupled to the odd bit lines, respectively.

Figure 11:
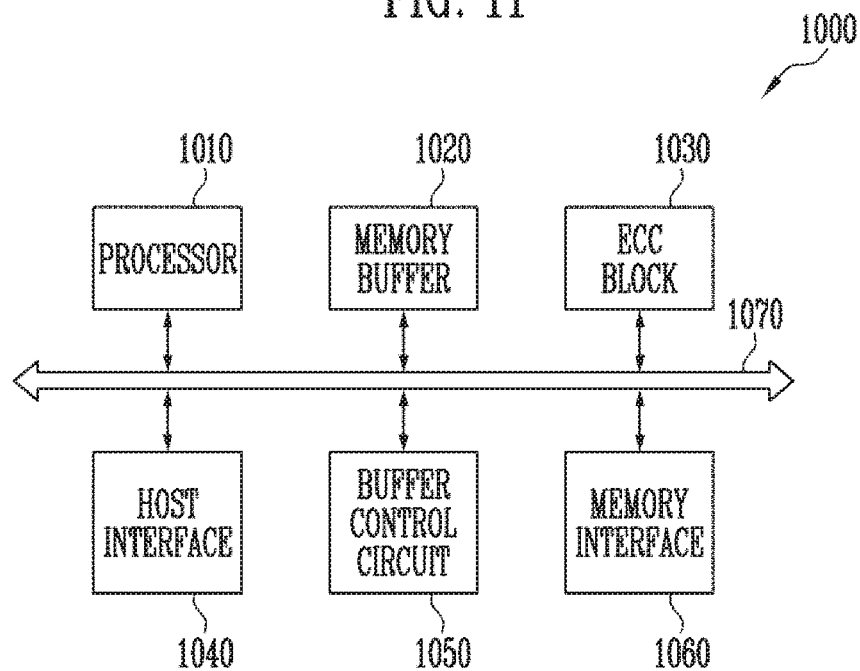
FIG. 11 is a diagram illustrating an embodiment of the memory controller shown in FIG. 1.

FIG. 11 is a diagram illustrating an embodiment of the memory controller 200 of FIG. 1.

The memory controller 1000 may be coupled to a host and a memory device. In response to a request provided from the host, the memory controller 1000 may access the memory device. For example, the memory controller 1000 may be configured to control at least one of a write, read, erase, and background operations of the memory device. The memory controller 1000 provides an interface between the memory device and the host. The memory controller 1000 may run firmware such as an FTL for controlling the memory device.

Referring to FIG. 11, the memory controller 1000 may include a processor 1010, a memory buffer 1020, an error correction code (ECC) block 1030, a host interface 1040, a buffer control circuit 1050, a memory interface 1060, and a bus 1070.

The bus 1070 may provide communication and power channels between the various components of the memory controller 1000.

The processor 1010 may control the overall operation of the memory controller 1000. The processor 1010 may perform a logical operation. The processor 1010 may communicate with an external host through the host interface 1040. The processor may communicate with the memory device through the memory interface 1060. The processor 1010 may communicate with the memory buffer 1020 through the buffer control circuit 1050. The processor 1010 may control the operation of the storage device by using the memory buffer 1020 as a working memory, a cache memory or a buffer memory.

The processor 1010 may perform the function of a flash translation layer (FTL). The processor 1010 may translate a logical block address (LBA), provided by the host, into a physical block address (PBA) through the FTL. The FTL may receive the LBA using a mapping table and translate the LBA into the PBA. Examples of an address mapping method performed through the FTL may include various methods according to a mapping unit. Representative address mapping methods include a page mapping method, a block mapping method, and a hybrid mapping method.

The processor 1010 may randomize data provided from the host. For example, the processing unit 1010 may use a randomizing seed to randomize data provided from the host. The randomized data may be provided, as data to be stored, to the memory device and may be programmed in the memory cell array.

The processor may derandomize data provided from the memory device during a read operation. For example, the processor 1010 may derandomize the data provided from the memory device using a derandomizing seed. The derandomized data may be outputted to the host.

In an embodiment, the processor 1010 may run software, firmware or a combination thereof to perform randomizing and derandomizing operations.

In an embodiment, the processor 1010 may include the device lock control unit 210, and may perform the operation of the device lock control unit 210 which were described above with reference to FIGS. 1 and 2. Alternatively the device lock control unit 210 of FIGS. 1 and 2 may be a separate component of the memory controller 1000.

The memory buffer 1020 may be used as a working memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC block 1030 may perform error correction. The ECC block 1030 may perform ECC encoding based on data to be written to the memory device through the memory interface 1060. The ECC-encoded data may be transferred to the memory device through the memory interface 1060. The ECC block 1030 may perform ECC decoding based on data provided from the memory device through the memory interface 1060. In an example, the CC block 1030 may be included as the component of the memory interface 1060 in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), Multi Media Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

In an embodiment, the memory controller 1000 may not include the memory buffer 1020 and the buffer control circuit 1050.

In an embodiment, the processor 1010 may control the operation of the memory controller 1000 using codes. The processor 1010 may load codes from a nonvolatile memory device (e.g., ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, and may neither interfere with each other nor influence each other. The data bus may be coupled to the host interface 1040, the buffer control circuit 1050, the ECC block 1030, and the memory interface 1060. The control bus may be coupled to the host interface 1040, the processor 1010, the buffer control circuit 1050, the memory buffer 1020, and the memory interface 1060.

In an embodiment, the memory controller 1000 a memory device 100 may be integrated into a single semiconductor device. In an embodiment, the memory controller 1000 and the memory device 100 may be integrated into a single semiconductor device to configure a solid state drive (SSD). The memory controller 1000 and the memory device 100 may be integrated into a single semiconductor device to configure a memory card. For example, the memory controller 1000 and the memory device 100 may be integrated into a single semiconductor device to configure a memory card such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS), FIG. 12 is a block diagram illustrating a memory card system to which the storage device according to an embodiment of the present disclosure is applied.

Figure 12:
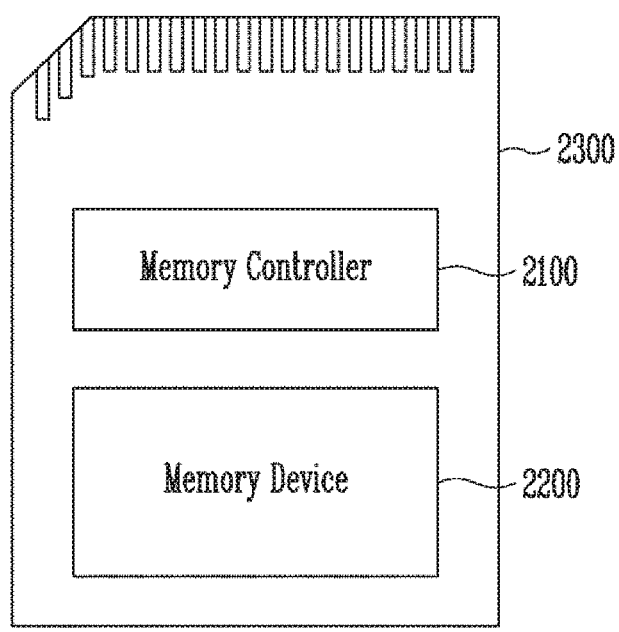
FIG. 12 is a block diagram illustrating a memory card system to which the storage device according to an embodiment of the present disclosure is applied.

Referring to FIG. 12, a memory card system 2000 may include a memory controller 2100, a memory device 2200, and a connector 2300.

The memory controller 2100 is coupled to the memory device 2200, The memory controller 2100 may access the memory device 2200. For example, the memory controller 2100 may control the read, write, erase, and background operations of the memory device 2200. The memory controller 2100 may provide an interface between the memory device 2200 and a host. The memory controller 2100 may run firmware for controlling the memory device 2200. The memory controller 2100 may be implemented in the same way as the memory controller 200, described above with reference to FIGS. 1 and 2.

In an embodiment, the memory controller 2100 may include components, such as a RAM, a processing unit, a host interface, a memory interface, and an ECC block.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), a Spin-Torque Magnetic RAM (STT-MRAM).

The device lock operation of the memory controller, described above with reference to FIGS. 1 to 5, may be performed by the memory controller 2100. Here, the sensor unit 220, described above with reference to FIG. 1, may be disposed within the memory device 2200. Alternatively, although not illustrated in the drawing, the sensor unit 220 may be implemented on the memory card system 2000 independently of the memory controller 2100 and the memory device 2200.

In an embodiment, the memory controller 2100 or the memory device 2200 may be packaged in any suitable package type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like, and may be provided as a single semiconductor package. Alternatively, the memory device 2200 may include a plurality of nonvolatile memory chips, which may be packaged based on the above-described package types and may be provided as a single semiconductor package.

In an embodiment, the memory device 2200 may be the memory device 100, described above with reference to FIGS. 1 and 6 to 10.

Figure 13:
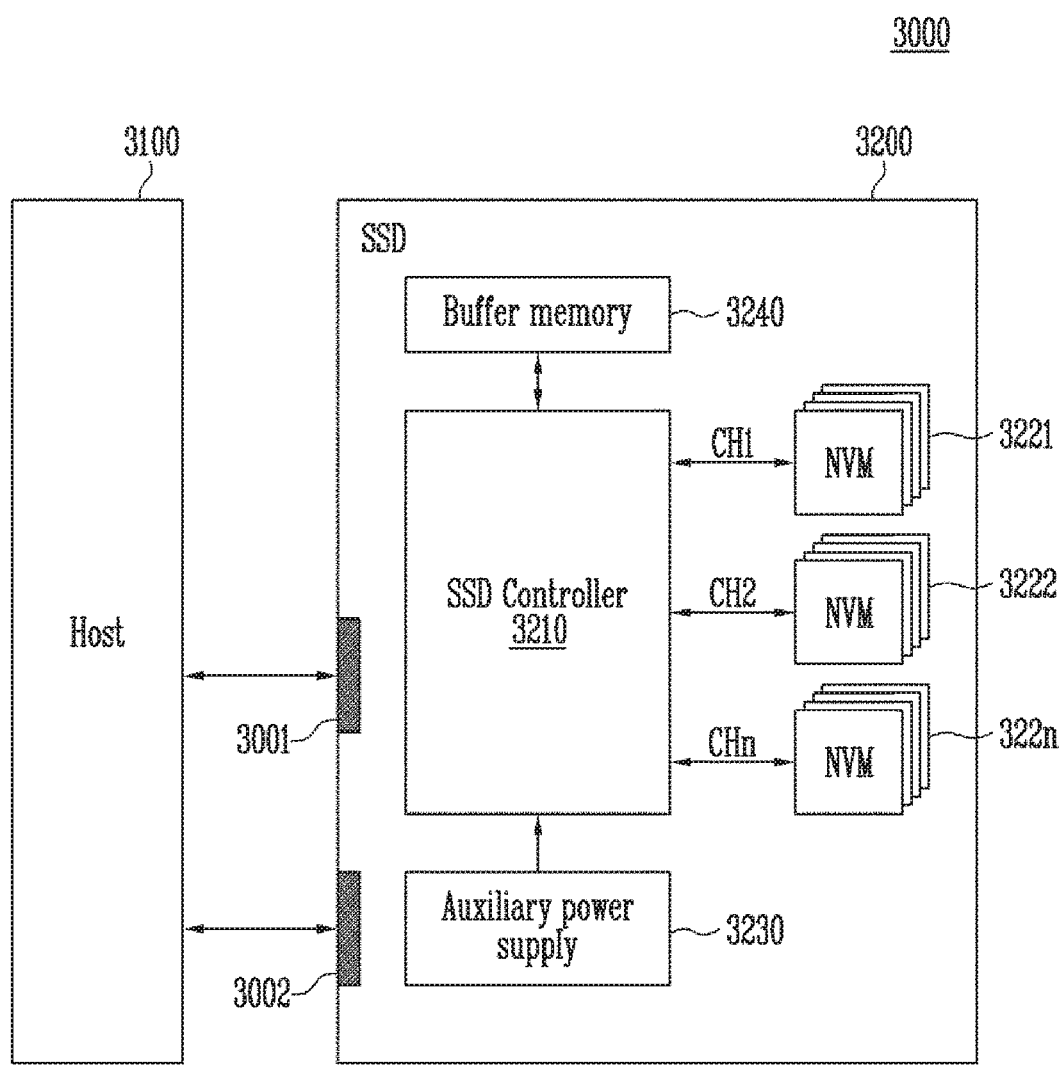
FIG. 13 is a block diagram illustrating a Solid State Drive (SSD) system to which the storage device according to an embodiment of the present disclosure is applied.

FIG. 13 is a block diagram illustrating an example of a solid state drive (SSD) system to which the storage device according to an embodiment of the present disclosure is applied.

Referring FIG. 13, an SSD system 3000 may include a host 3100 and an SSD 3200. The SSD 3200 may exchange signals with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200, described above with reference to FIGS. 1 and 2.

The SSD controller 3210 may control the plurality of flash memories 3221 to 322n in response to the signals SIG received from the host 3100. In an embodiment, the signals SIG may be signals based on the interfaces of the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (DATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not supplied smoothly. The auxiliary power supply 3230 may be positioned inside the SSD 3200 or positioned outside the SSD 3200. For example, the auxiliary power supply 3230 may be disposed in a main board and supply auxiliary power to the SSD 3200.

The buffer memory 3240 functions as a buffer memory of the SSD 3200. For example, the buffer memory 3240 may temporarily store data provided from the host 3100 or data provided from the plurality of flash memories 3221 to 322$n$ or may temporarily store metadata (e.g., mapping tables) of the flash memories 3221 to 322$n$. The buffer memory 3240 may be implemented with a volatile memory such as DRAM, SDRAM, DDR SDRAM, LPDDR SDRAM, and GRAM or nonvolatile memory such as FRAM, ReRAM, STT-MRAM, and PRAM.

In an embodiment, each of the nonvolatile memories 3221 to 322$n$ may be the memory device 100, described above with reference to FIGS. 1 and 6 to 10.

Figure 14:
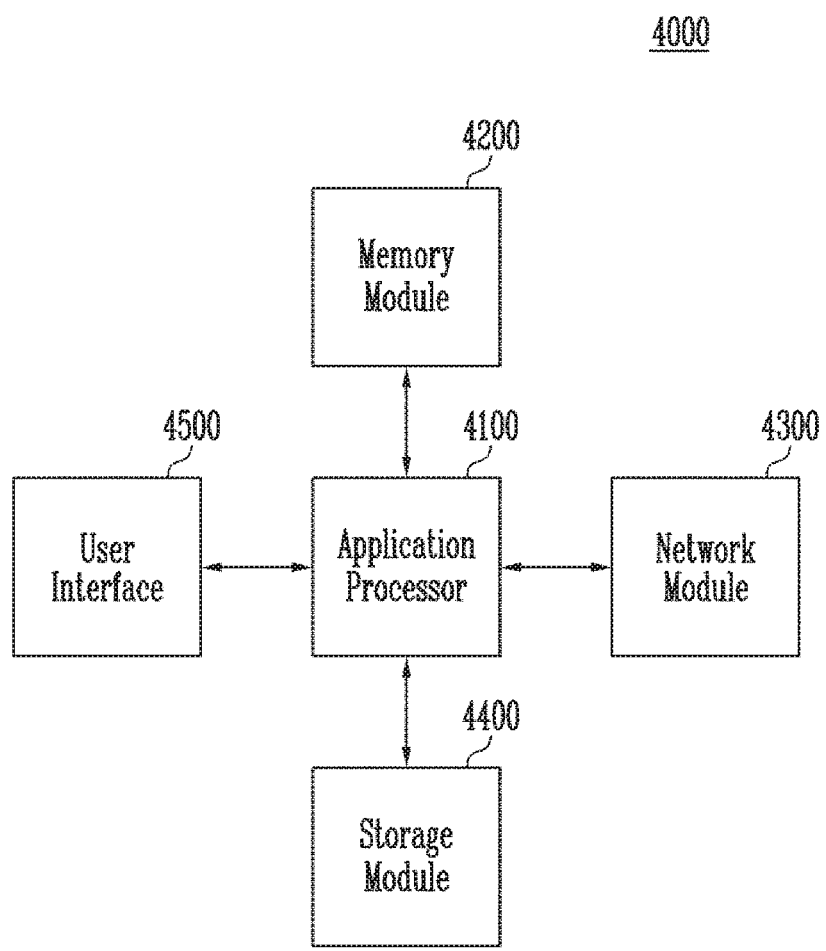
FIG. 14 is a block diagram illustrating a user system employing a storage device according to an embodiment of the present disclosure.

FIG. 14 is a block diagram illustrating a user system to which the storage device according to an embodiment of the present disclosure is applied.

Referring to FIG. 14, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDARM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data provided from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, and each of the plurality of nonvolatile memory devices may be the memory device 100, described above with reference to FIGS. 1 and 6 to 10.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a motor.

In accordance with the present disclosure, there are provided a storage device and a method of operating the same, which may protect the storage device from physical movement.

While the exemplary embodiments of the present disclosure have been disclosed for illustrative purposes, those skilled in the art will appreciate that various modifications, additions and substitutions are possible. Therefore, the scope of the present disclosure must be defined by the accompanying claims and equivalents thereof rather than by the above-described embodiments.

Although the embodiments of the present disclosure have been disclosed, those skilled in the art will appreciate that various modifications, additions and substitutions are possible, without departing from the scope and spirit of the present disclosure.

In the above-discussed embodiments, all steps may be selectively performed or skipped. In addition, the steps in each embodiment may not always be performed in regular order. Furthermore, the embodiments disclosed in the present specification and the drawings aims to help those with ordinary knowledge in this art more clearly understand the present disclosure rather than to limit the bounds of the present disclosure. One of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the accompanying claims and equivalents thereof.

What is claimed is:

1. A memory controller in a storage device, comprising:
   a device lock detection unit configured to output a detection signal related to physical movement of the storage device; and
   a device control lock unit configured to lock a device operation to cause to ignore a command provided from a host based on the detection signal and to provide the host with an abort signal indicating that a state of the command is ignored.

2. The memory controller according to claim 1, wherein the command is one of a write command and a read command.

3. The memory controller according to claim 1,
wherein the memory controller is configured to send an enable signal indicating that the storage device is in locked status.

4. The memory controller according to claim 1,
wherein the memory controller is configured to refrain performing an operation relating to accessing a memory device in response to the detection signal.

5. The memory controller according to claim 1, wherein the device lock detection unit is configured to collect information about the physical movement of the storage device.

6. The memory controller according to claim 1, further comprising: a sensor unit configured to detect the physical movement of the storage device.

7. A memory controller in a storage device, comprising:
a device lock detection unit configured to output a detection signal related to physical movement of the storage device;
a device control lock unit configured to lock a device operation to selectively perform a command provided from a host based on the detection signal and to provide the host with an abort signal indicating that a state of the command is ignored; and
a register configured to store a value changed according to a status of a device lock operation.

8. The memory controller according to claim 7,
wherein the register is configured to store information including locked status.

9. The memory controller according to claim 8,
wherein the locked status indicates whether the memory controller is in a state capable of selectively performing an operation corresponding to the command provided from the host.

10. The memory controller according to claim 7,
wherein the memory controller is configured to refrain from performing an operation relating to accessing a memory device according to the stored value at the register.

11. The memory controller according to claim 7,
wherein the memory controller is configured to perform an operation, previously provided from the host, to access a memory device according to the stored value at the register.

12. The memory controller according to claim 11,
wherein the memory controller is configured to perform a flush operation to provide data temporarily stored in a write cache buffer included in the memory controller to the memory device.

13. The memory controller according to claim 7, wherein the register is configured to store a password received with the command.

14. The memory controller according to claim 13,
wherein the password is used to change a mode of a device operation.

15. A memory controller in a storage device, comprising:
a device lock detection unit configured to output a detection signal related to physical movement of the storage device and to provide a host with an abort signal indicating that a state of a command is ignored; and
a device control lock unit, during executing of the command provided from the host, configured to lock the storage device to cause to interrupt the executing of the command in response to the detection signal.

16. The memory controller according to claim 15, further comprising:
a register configured to store a value changed according to the detection signal.

* * * * *